United States Patent [19]
Brotz

[11] Patent Number: 4,851,285
[45] Date of Patent: Jul. 25, 1989

[54] CELLULAR CARBON STRUCTURE AND METHOD FOR PRODUCING SAME

[76] Inventor: Gregory R. Brotz, P.O. Box 1322, Sheboygan, Wis. 53081

[21] Appl. No.: 738,402

[22] Filed: May 28, 1985

Related U.S. Application Data

[63] Continuation-in-part of Ser. No. 612,718, May 21, 1984, Pat. No. 4,626,612, which is a continuation-in-part of Ser. No. 588,344, Mar. 12, 1984, Pat. No. 4,628,143.

[51] Int. Cl.⁴ .................................................. B32B 9/00
[52] U.S. Cl. ............................... 428/304.4; 264/29.1; 427/217; 427/227; 427/243; 428/313.3; 428/408
[58] Field of Search ............................ 204/9, 11, 24; 264/29.1; 427/113, 217, 227, 229, 238, 243, 244, 247; 428/304.4, 408, 313.3

[56] References Cited

U.S. PATENT DOCUMENTS

| | | | |
|---|---|---|---|
| 3,810,963 | 5/1974 | Benton et al. | 264/29.1 |
| 4,025,689 | 5/1977 | Kobayashi et al. | 264/29.1 |
| 4,136,428 | 1/1979 | Godsey et al. | 428/408 |
| 4,579,632 | 4/1986 | Brotz | 204/11 |
| 4,666,766 | 5/1987 | Brotz | 427/217 |
| 4,676,996 | 6/1987 | Brotz | 427/222 |

FOREIGN PATENT DOCUMENTS 1912597 10/1969 Fed. Rep. of Germany ...... 428/408

Primary Examiner—William J. Van Balen
Attorney, Agent, or Firm—William Nitkin

[57] ABSTRACT

A structure of a cellular carbon foam with metallic plating on the interior surfaces of its cells which structure may include other interior coatings such as rubber or similar compounds and the method for producing same.

8 Claims, 3 Drawing Sheets

CELLULAR CARBON STRUCTURE AND METHOD FOR PRODUCING SAME

This application is a continuation-in-part of my previous application for a Foamed Multiple Thermocouple filed 05/21/84, Ser. No. 612,718 now U.S. Pat. No. 4,626,612 which is a continuation-in-part of my previous application for a Foamed Nuclear Cell filed 03/12/84, Ser. No. 588,344 now U.S. Pat. No. 4,628,143.

BACKGROUND OF THE INVENTION

1. Field of the Invention

The structure and method of this invention relate to a cellular carbon structure and method for producing same and more particularly relate to a cellular carbon structure with coatings and/or containing other materials within its cells, such structures suitable for a variety of uses.

2. Description of the Prior Art

Lightweight carbon structures including foams are used for many purposes in the prior art. Some of such structures including cellular, honeycomb, spheres and fiber carbon matrices are disclosed in the prior art listed below:

| U.S. Pat. No. | Inventor(s) |
| --- | --- |
| 3,567,807 | Shannon |
| 3,778,336 | Adams |
| 3,810,963 | Benton et al |
| 3,825,460 | Yoshikawa et al |
| 3,927,186 | Kinton et al |
| 3,969,124 | Stewart |
| 4,025,689 | Kobayashi et al |

SUMMARY OF THE INVENTION

It is an object of this invention to produce an article of manufacture of cellular carbon foam which has the insides of its cells metallic plated for use in a variety of items including Dewar flasks and insulated containers. Such plated carbon foam structure can further be used as filler material in fuel tanks where flammable liquids or gases are stored and if such a tank were ruptured, the cellular nature of the structure would contain the liquid or gas and prevent all of the tank's contents from igniting at once in situations where a flame or other impetus to explode might be present such as, for example, an automobile crash.

It is a further object of this invention to provide a material suitable for use as a buoyant structure such as a boat hull. The material of this invention could also be utilized in structures used in other space projects which structures would be resistant to meteor penetration. Such structures can be produced by utilizing the plated carbon cellular foam of this invention with a rubber coating in its cells, sealing the cells off from one another.

It is a further object of this invention that such rubber-sealed cells can be evacuated or filled with hydrogen to effect a weight savings in lower atmosphere applications where extremely lightweight structures are desired.

It is yet still a further object of this invention to provide a method for the production of such desirable carbon foam structures.

DESCRIPTION OF THE PREFERRED EMBODIMENT(S)

Figure 1:
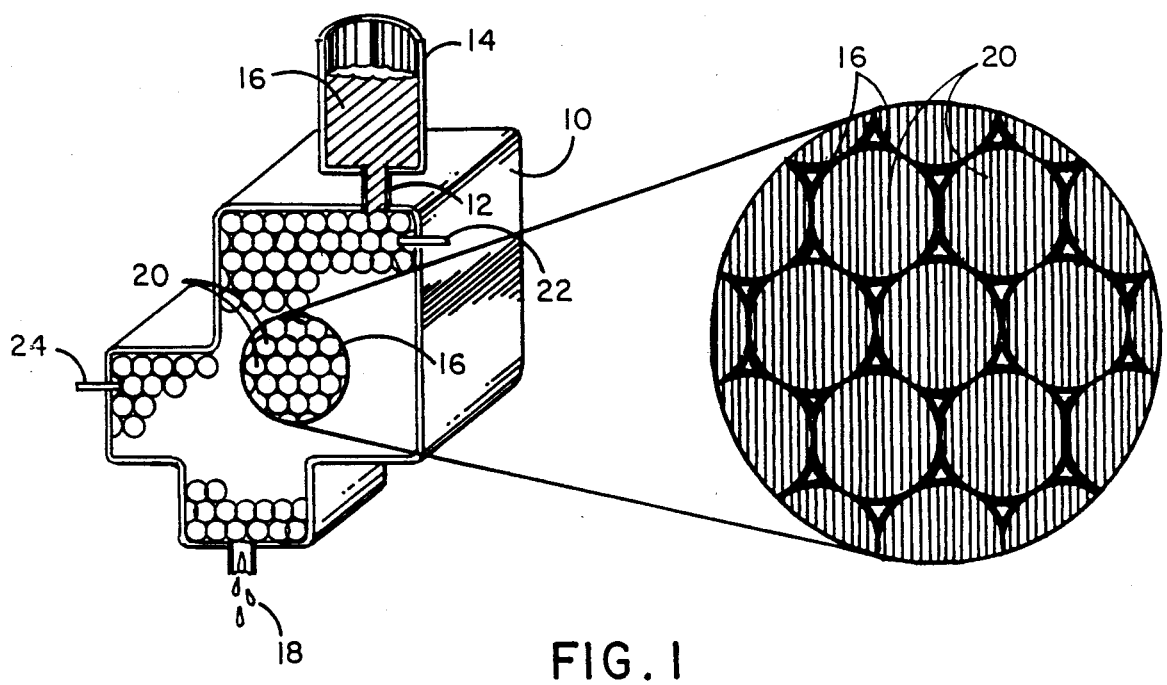
FIG. 1 illustrates a mold containing polystyrene balls and carbonizable liquid resin.
Figure 2:
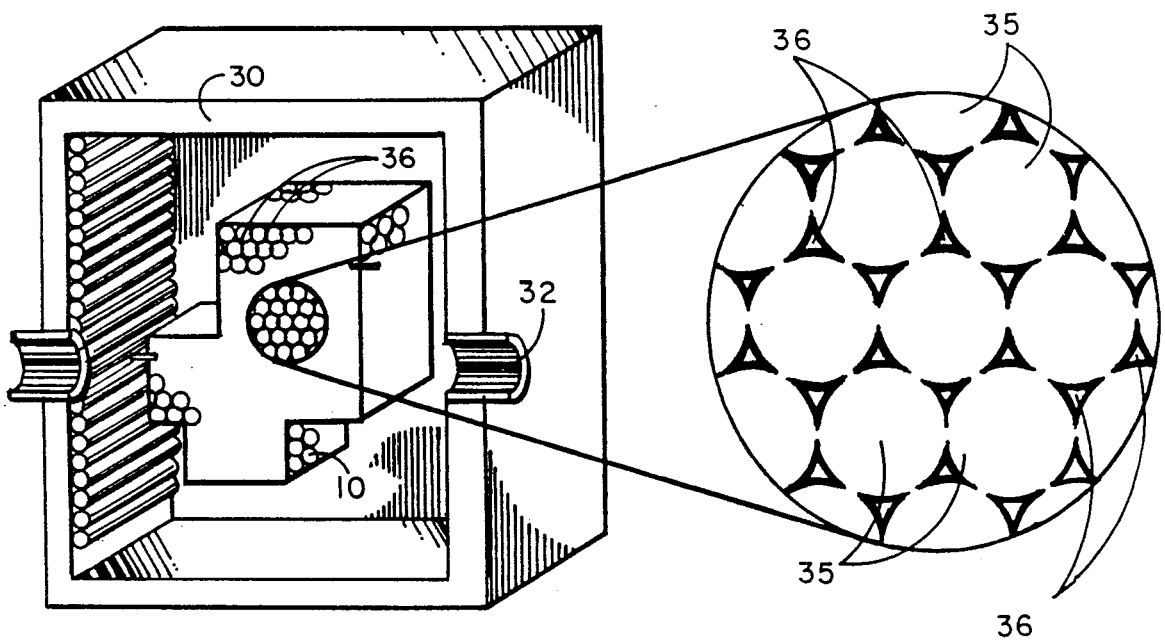
FIG. 2 illustrates the baking of the structure of this invention to vaporize the polystyrene balls and carbonize the cured resin.

FIG. 1 illustrates the basic formation of the structure of the carbon foam of this invention. Seen in this view is mold 10 which can be in any desired shape such as a boat hull, a sphere or, for example, the irregular shape as illustrated herein. First electrode 22 and second electrode 24 are implanted within the molding and can be accommodated in and separable from the mold when the molded object containing the electrodes is removed from mold 10. A plurality of ball members 20 which can be formed of expanded polystyrene or any other suitable thermoplastic material are packed tightly and make contact with one another within the mold. Inlet port 12 is provided at the top of the mold, and outlet port 18 is provided at the bottom of the mold. Carbonizable liquid resin 16, held in container 14, enters the mold through inlet port 12, coats balls 20 and any excess resin drains out through outlet port 18. A circular section of FIG. 1 is enlarged to show polystyrene balls 20 surrounded by resin 16. The carbonizable resin must utilize a solvent which is not a solvent for the polystyrene balls. If, for example, a phenolic resin is used, a solvent for the phenolic resin such as ethanol, which is not a solvent for polystyrene, could be used. If undehydrated single-stage phenolic resins are used, water can be the solvent which use can be advantageous because water can be easily handled since it is not flammable. As the mold illustrated in FIG. 1 fills with resin and the balls become well-coated therewith, any trapped air in the mold will escape out through inlet port 12. The liquid resin, however, in the illustrated embodiment does not coat the points of contact of the balls with one another. Any excess solvent can be driven off by entering a warm gas either via the inlet port and out the outlet port or vice versa to pass such gas through the mold. After the excess solvent has been driven off, the temperature of the gas can be increased to cure the resin before the baking step illustrated in FIG. 2. In FIG. 2 the article is carbonized in oven 30 causing the polystyrene balls to vaporize, the residue of which is removed by air circulation through vents 32 in the oven. The remaining hardened resin 36 carbonizes and becomes a hard open-cellular carbon foam because at the points of contact of the polystyrene balls no resin formed so that each empty spherical cell 35 is open to many other spherical cells as seen in the enlarged section of FIG. 2.

An example of this process is as follows:

Resin Solution

Solvent is ethanol
50% by weight phenolic novelac resin

50% by weight resole resin

The resole and novelac resins are ground together and dissolved in the solvent mixture to make a resin solution having a viscosity close to that of a thin motor oil. Into this solution is blended 55% by weight finely ground graphite. The graphite is heavy and 55% on top of the resin solution is not enough to produce a mixture so thick as not to run. A stainless steel cylinder having an open top at one end and a threaded bottom with a hole in the center at the other end is prepared by rubbing silicon oil on the inside surfaces of the cylinder. The oil is for mold release purposes. Polystyrene beads having a diameter of approximately ⅛" are poured into the cylinder. A rubber stopper is placed into the hole of the threaded bottom. A tightly fitting circular screen is forced into the top of the cylinder so as to put pressure on the beads so that they will make contact with each other. The resin graphite solution is poured into the cylinder to fill the cylinder and is allowed to stand for 15 minutes so that all trapped air comes to the top. The rubber stopper is removed and the resin solution allowed to drain out for thirty minutes. The cylinder is then placed into a forced air oven set at 300 degrees C. for three hours. The bottom of the cylinder is removed and the cured structure is taken out. The structure is then placed in a carbonizing furnace equipped with nitrogen flow and fired with a temperature profile of 100 degrees F. per hour to 2000 degrees F for a total of 20 hours.

In an additional embodiment the balls may not be arranged to contact one another and when heated, the vaporized products of the decomposing polystyrene escape through the structure during the carbonizing cycle forming channels therein to each cell.

If a very thin or dilute resin solution is used to coat extremely expanded polystyrene balls which have little matter or weight to produce byproducts during carbonization; and if a high vacuum is applied at the high temperature period of the carbonization cycle, when the then glassy carbon is in a red to white hot state to allow gas molecules to escape from the interior of the closed-cellular structure through the then thin glassy carbon walls and further if the vacuum is maintained during cooling, the resulting structure would be nonporous to gas on cooling and a permanent vacuum would be trapped within the individual cells of the structure. With thin cell walls contributing little weight, a completely fireproof structure could be made.

Figure 3:
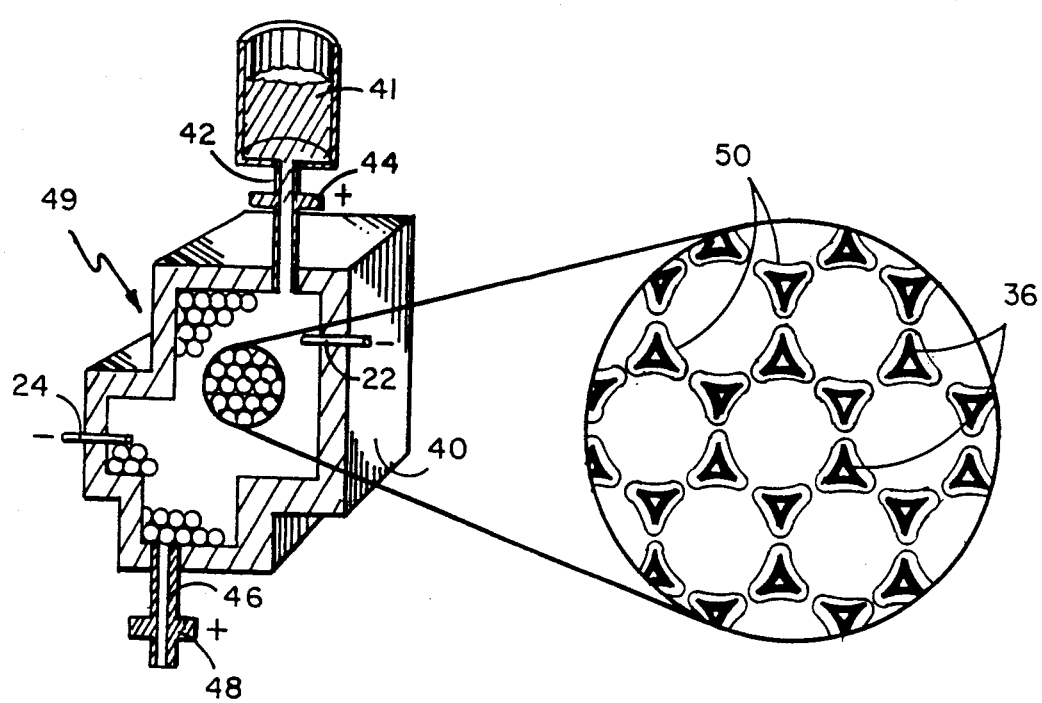
FIG. 3 illustrates the structure held within a case receiving electroplating solution to plate the interior of the cells of the carbon foam.

In FIG. 3 the article is placed in casing 40 and entry pipe 42, having electrode 44 attached thereto, enters into the top of the casing. Second exit pipe 46 is entered into the bottom of the casing having second electrode 48 attached thereto, both of which electrodes 44 and 48 can now be the positive electrodes, and first and second electrodes 22 and 24, previously inserted into the carbon foam mass as it was being formed, can now be utilized as the negative electrodes. A metallic plating bath 41 can be entered into casing 40 through entry pipe 42 with current passed through the electrodes to cause plating to be deposited on the inside of the cells of the carbon cellular foam.

Other processes can be used to provide a metallized coating on such an open-cellular foam. A conductive coating can be applied such as an epoxy resin containing a powdered metal such as copper or silver. Such conductive epoxies or equivalent conductive coatings can be electroplated directly as soon as the coating has hardened without the necessity of carbonizing the foam although a heat treatment at 250 degrees F. for a few hours will increase the conductivity of such coating. Many conductive paints can also be used such as silver or other metal-based paints, conductive polymers or other equivalent coatings.

An enlarged view of a circular section of the molded article in FIG. 3 shows carbon foam 36 with metallic plating 50 deposited thereon. This article can be used as mentioned above for a variety of applications. For certain applications further treatment is necessary.

Figure 4:
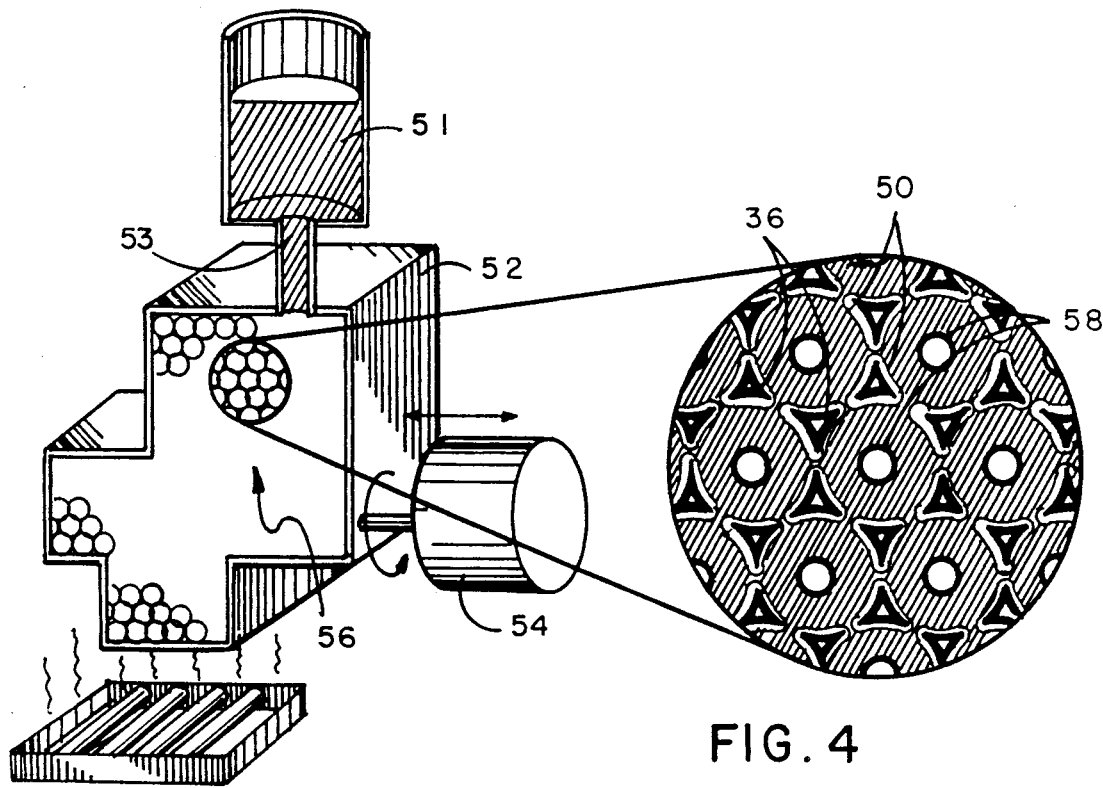
FIG. 4 illustrates the structure receiving powdered rubber and being vibrated, omni-rotated and heated.

As seen in FIG. 4 the molded article can have powdered rubber compound 51 or equivalent material entered therein after the plating step such as from a rubber powder container above entry port 53 and which powder passes into structure container 52 which holds the molded article. Other rubber compositions can be used such as rubber in solution. The solvent of such rubber solution would be driven off during the heating cycle. Rubber of the liquid type that is set by a catalyst can also be used. Vacuum can be applied to the exit port during the entry of such rubber liquid to help facilitate the rubber's impregnation into the foam. It should be noted that the rubber container is removed before the heating and shaking of container 52 is started as described below. As the rubber compound is introduced into the molding, the molding is shaken and omni-rotated by any suitable shaker and omni-rotating means 54 so as to cause the rubber compound to enter into all of the cells of the open-cellular carbon foam. The molded article can then be heated such as by the heater depicted below the structure so as to melt the rubber during its omni-rotation which melting creates a coating as seen in the expanded circular section of FIG. 4 where central carbonized resin 36 is seen coated first by plating 50 and then by rubber 58 which coating seals each cell and forms a useful structure as described above.

Another process of coating the expanded polystyrene balls is by disk balling. Polystyrene balls are placed in a disk baller along with an amount of finely divided carbonaceous resin. The disk baller is slowly heated until the temperature of the mass in the baller is close to the melting point of the resin at which time the mass aglomerates. The thus-formed mass is then put into a hot mold where it is shaped and heated further to cure the resin. After the resin is cured, the structure is removed from the mold and carbonized. This process can produce a closed-cellular foam.

In yet another embodiment of this invention, expanded polystyrene balls can be filled with a metal powder. Polystyrene resin and aluminum powder are first coextruded into strands. The strands are then pelletized. The pellets are dropped into a column having hot nitrogen gas flowing upwards therethrough. As the pellets fall, they reform into spheres and expand. The spheres do not aglomerate and are discrete spheres which are molded into the desired shape which, after being fully solidified, can be coated with a carbonizable resin in solution.

An example of a similar process is as follows:
60% by weight polystyrene resin
37% by weight aluminum powder
3% by weight Celogen, a dry blowing agent which releases carbon dioxide The above ingredients are blended and coextruded in a mixing-type screw extruder. The extrudate is in the form of a 3/16" diameter strand which is passed into a rotary chopper-type pelletizer. The formed pellets are heated in a fluid bed which is heated and fluidized by passing dry steam up through the bed. After the beads have expanded in the fluid bed, the steam is turned off and cool air from a compressed air source is passed through the bed until the beads have cooled. The beads may have to be broken up after they have cooled. The beads are then placed into a disk baller and the machine is turned on. As the beads are now falling on top of each other in the baller, an amount of ethanol is sprayed onto the beads to coat their surfaces. After the surfaces have been wetted thoroughly, a ball-milled phenolic resole resin is added into the disk baller in stages. At first the ingredients mass up but as the resin takes up the solvent, the mass breaks up and separates. If there is loose resin after the mass breaks up and the beads are well-coated, the loose resin is separated by screening. In this example ethanol is atomized into the baller, and the loose resin is taken back up by the beads. The coated beads are now placed in a teflon-coated non-conductive mold and this assembly is placed into a microwave oven where they are preheated. When they are removed from the microwave oven, pressure is put on the top of the beads to compress them together while the heat cures the resin. The beads are at about 450 degrees F. when they are removed from the microwave oven. The pressure is allowed to remain on the mold until the resin is cured, about 30 minutes. The now-cured structure is removed from the mold and is carbonized.

These processes can produce closed-cellular structures in which it is impossible to circulate plating bath. After these spheres are coated with carbonizable resin, they form a nonporous matrix. After the resin has cured, the structure can be fired in a carbonizing furnace under inert conditions during which time the polystyrene portion of the expanded balls vaporizes and decomposes. The metal particulate then coats the walls of the cells evenly because as the polystyrene balls melt, the cohesive energy of the polymer causes it to spread itself evenly about the inside surface of the cured resin matrix. This molten polymer carries the metal particulate along with it so that the metal is also spread evenly. A curing agent or heat-curable adhesive can be added to the polymer-metal mixture before they are coextruded. This addition will ensure that as the temperature rises during carbonization, the metal particulate will stay in place and will not sag to the bottom of the cells.

The use of a curing agent or heat-curable adhesive is most important when using metals having high melting points or metals with melting temperatures close to the upper temperature of the carbonizing or graphitizing stages. The metal particulate fuses to make a continuous metal coating on the inside surface of each cell. It should be noted that the upper limit of the furnace temperature is defined mostly by the melting temperature of the metal being used. If a metal is used that has a vaporization temperature below the upper temperature limit of the carbonization cycle, then the metal will be deposited on the surfaces by condensation as the structure is cooled. Also, the greater the percentage of metal in the sphere, the less the amount of metal carbides that will be formed from the carbon from the decomposed polystyrene. However, as the polystyrene volatiles penetrate the cell walls, they will leave behind the metal particulate, thus concentrating the metal in the cells.

While metallized closed-cellular structures are not necessarily stronger than the carbon matrix alone, in terms of uses to resist projectile penetration, they may be more desirable since any projectile would have to penetrate each metal sphere to proceed further into the structure. In conventional anti-piercing plates, once failure has occurred along a fracture site, the fracture line may proceed through the thickness of the structure with relative ease. In the instant invention the surfaces being penetrated are those of hollow spheres and spheres distribute pressure uniformly about themselves. As a projectile penetrates, it must break each of the metal spheres individually and each of the spheres presents a new fracture surface. Because a new fracture must start at each sphere because of the nature of the structure, a projectile must use up energy in the form of inertia which ultimately would cause it to slow and stop.

Figure 5:
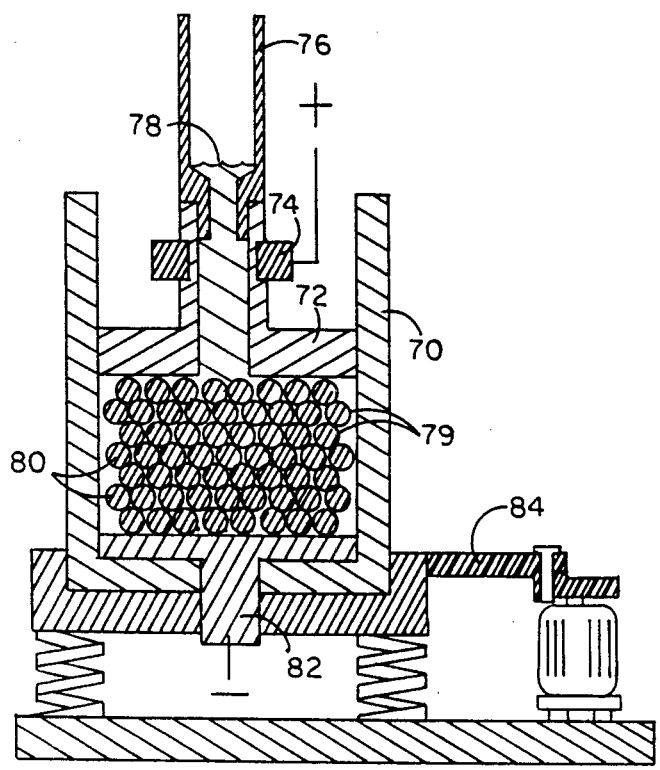
FIG. 5 illustrates an alternate mold.
Figure 6:
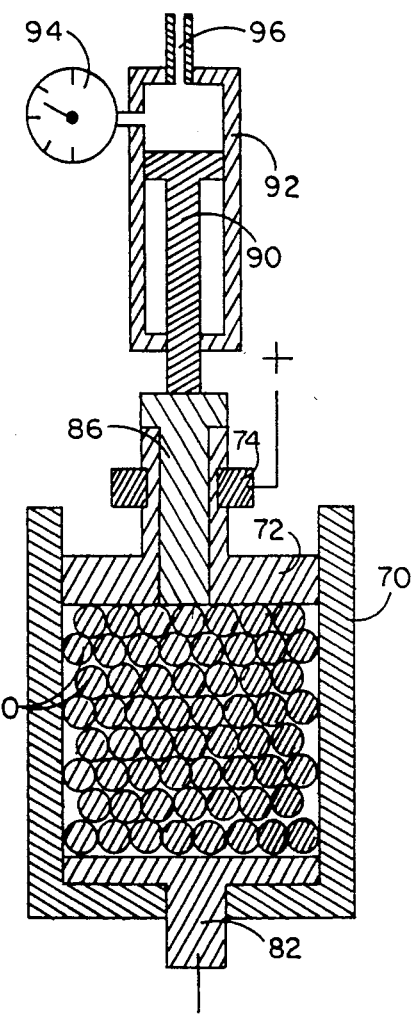
FIG. 6 illustrates the mold of FIG. 5 with ball members expanded therein.

FIGS. 5 and 6 illustrate a further example of the process using tefloncoated mold 70 with metal bottom 82 that is a pole for microwave heating. Mold 70 is filled with unexpanded polystyrene resin beads 80 and top member 72, which also contacts the other pole 74 for microwave heating, is placed on top of the beads. Resin 78 is added from resin container 76 through an aperture in top 72 into mold 70 around beads 80. The mold can be vibrated by vibration means 84 to cause the ground resin to penetrate the interstices between the beads. As seen in FIG. 6 plug 86 can be placed in the aperature in top 72, and piston 90 in cylinder 92 can apply pressure from pressure line 96 measured by gauge 94 to top 72. The microwave poles are energized with a frequency of the proper wavelength and power to cause the enclosed material to heat up. The thermosetting resin 78 and polystyrene beads 80 will heat up simultaneously and at the boiling point of water polystyrene beads 80 will expand due to the moisture present in them. Top 72 of mold 70 rises to allow for the increase in volume while still maintaining pressure on the material. As the temperature reaches the curing temperature of the thermosetting resin, the resin cures to become a rigid structure. The power to the microwave poles is turned off and the structure is removed. This embodiment can produce very unusual cell shapes if the pressure on the top of the material of the mold is increased at the point between the expansion temperature of the polystyrene beads and the curing temperature of the thermosetting resin. The formed structure can then be carbonized. At the end of the carbonizing cycle and before cooling, oxygen can be passed therethrough to open up or reticulate the cellular structure, if desired. This carbon structure can then be placed in an electroless plating bath where the bath plates the cell walls as it soaks into the structure. The bath can also be circulated through the structure if the structure is confined in a chamber with walls that conform to that of the carbon structure's shape as shown in FIG. 3.

Although the present invention has been described with reference to particular embodiments, it will be apparent to those skilled in the art that variations and modifications can be substituted therefor without departing from the principles and spirit of the invention.

I claim:

1. A structure comprising:
   an open-cellular carbon foam;
   metallic plating on the interior surfaces of the cells of said carbon foam; and
   a rubber coating on said plated surface and between said cells sealing off each of said cells from one another.

2. The structure of claim 1 wherein said cells contain a gas.

3. The structure of claim 1 wherein said cells have a vacuum defined therein.

4. A method of producing a structure comprising the steps of:

packing a plurality of polystyrene balls within a mold;

introducing a carbonizable liquid resin into said mold;

coating said balls with said resin;

curing said resin;

baking the structure to vaporize said polystyrene balls;

forming a multiplicity of open cells in said structure by vaporization of said balls to form an open-cellular structure;

carbonizing said cellular structure;

plating the interiors of said multiplicity of cells within said structure with a metallic coating;

introducing a powdered rubber-like material into said opencellular structure;

vibrating said structure;

omni-rotating said structure;

heating said structure to melt said rubber-like material;

coating said multiplicity of cells with said melted rubber-like material;

sealing said openings between said cells with said rubber-like material;

cooling said rubber-like coating; and solidifying said rubber-like coating by said cooling action.

5. The method of claim 4 further including before heating said structure to melt said rubber-like material, the step of:

entering a gas into said multiplicity of cells of said structure.

6. The method of claim 4 further including before heating said structure to melt said rubber-like material, the step of:

vacuumizing said multiplicity of cells of said structure.

7. The method of claim 6 wherein the plating of the interiors of said multiplicity of cells within said structure with a metallic coating occurs during said carbonizing step by including the step of introducing a metal powder into said open cells before the step of carbonizing said cellular structure and coating the inside of said cells with said metal powder which is fused by the heat of said carbonizing step to form said metallic coating on the interiors of said cells.

8. A structure produced by the process of claim 4.

* * * * *